(12) United States Patent
Kadoi et al.

(10) Patent No.: US 10,973,112 B2
(45) Date of Patent: Apr. 6, 2021

(54) CHARGED PARTICLE BEAM DEVICE

(71) Applicant: HITACHI HIGH-TECH CORPORATION, Tokyo (JP)

(72) Inventors: Ryo Kadoi, Tokyo (JP); Wen Li, Tokyo (JP); Naoya Ishigaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/631,256

(22) PCT Filed: Jul. 18, 2017

(86) PCT No.: PCT/JP2017/025930
§ 371 (c)(1),
(2) Date: Jan. 15, 2020

(87) PCT Pub. No.: WO2019/016857
PCT Pub. Date: Jan. 24, 2019

(65) Prior Publication Data
US 2020/0221566 A1     Jul. 9, 2020

(51) Int. Cl.
*H05H 5/03* (2006.01)
*H01J 37/06* (2006.01)
(Continued)

(52) U.S. Cl.
CPC ............... *H05H 5/03* (2013.01); *H01J 37/06* (2013.01); *H01J 37/241* (2013.01); *H01J 37/244* (2013.01); *H01J 2237/0473* (2013.01)

(58) Field of Classification Search
CPC ........ H05H 5/03; H01J 37/241; H01J 37/244; H01J 2237/0473
See application file for complete search history.

(56) References Cited

U.S. PATENT DOCUMENTS 3,678,334 A * 7/1972 Dugdale ................. H01J 17/44
  315/111.81
3,946,268 A * 3/1976 Welter ................... H01J 37/073
  315/382
(Continued)

FOREIGN PATENT DOCUMENTS

JP        55-78452 A     6/1980
JP        57-203453 U    12/1982
(Continued)

*Primary Examiner* — Amy Cohen Johnson
*Assistant Examiner* — Syed M Kaiser
(74) *Attorney, Agent, or Firm* — Miles & Stockbridge, P.C.

(57) ABSTRACT

The present invention prevents breakage of a chip by using a simple configuration even when an extraction-electrode power source cannot apply voltage to an extraction electrode due to a malfunction, etc. This charged particle beam device is provided with: a charged particle source; an extraction electrode that extracts charged particles from the charged particle source; an extraction-electrode power source that applies voltage to the extraction electrode; an accelerating electrode for accelerating the charged particles; an accelerating power source that applies voltage to the accelerating electrode; and a diode and a resistor which are connected in series between a middle stage of the accelerating power source and the output side of the extraction-electrode power source.

18 Claims, 6 Drawing Sheets

(51) Int. Cl.
*H01J 37/24* (2006.01)
*H01J 37/244* (2006.01)

(56) References Cited

U.S. PATENT DOCUMENTS

| | | | | |
|---|---|---|---|---|
| 4,551,606 A | * | 11/1985 | Inoue | B23K 15/02 |
| | | | | 219/121.34 |
| 4,864,228 A | * | 9/1989 | Richardson | G01R 31/305 |
| | | | | 324/754.22 |
| 5,440,124 A | * | 8/1995 | Kelly | H01J 37/285 |
| | | | | 250/287 |
| 5,504,340 A | * | 4/1996 | Mizumura | H01J 37/3056 |
| | | | | 250/423 R |
| 6,320,319 B1 | | 11/2001 | Iwai et al. | |
| 8,253,057 B1 | * | 8/2012 | Hunt | H05H 1/46 |
| | | | | 219/121.36 |
| 2006/0113493 A1 | * | 6/2006 | Kabasawa | H01J 37/15 |
| | | | | 250/492.21 |
| 2007/0075240 A1 | * | 4/2007 | Hieke | G21K 5/02 |
| | | | | 250/282 |
| 2008/0067445 A1 | * | 3/2008 | Kaga | H01J 37/18 |
| | | | | 250/492.21 |
| 2008/0224064 A1 | * | 9/2008 | Morita | B82Y 10/00 |
| | | | | 250/396 R |
| 2009/0256081 A1 | * | 10/2009 | Kaga | H01J 37/12 |
| | | | | 250/396 R |
| 2010/0219339 A1 | * | 9/2010 | Ogawa | H01J 37/28 |
| | | | | 250/306 |
| 2012/0199758 A1 | * | 8/2012 | Kawanami | H01J 27/26 |
| | | | | 250/397 |
| 2015/0279612 A1 | * | 10/2015 | Yagita | H01J 37/3171 |
| | | | | 250/396 R |
| 2015/0371822 A1 | * | 12/2015 | Amano | H01J 37/3171 |
| | | | | 250/397 |
| 2016/0064179 A1 | * | 3/2016 | Yamashita | H01J 37/20 |
| | | | | 250/396 R |
| 2016/0247663 A1 | * | 8/2016 | Schubert | H01J 37/1472 |
| 2018/0066986 A1 | * | 3/2018 | Kasai | G01J 1/42 |
| 2018/0152093 A1 | * | 5/2018 | Zushi | H03K 17/0822 |

FOREIGN PATENT DOCUMENTS

| | | |
|---|---|---|
| JP | 61-42770 U | 3/1986 |
| JP | 2000235838 A | 8/2000 |
| JP | 2004-164960 A | 6/2004 |

\* cited by examiner

CHARGED PARTICLE BEAM DEVICE

TECHNICAL FIELD

The present invention relates to a charged particle beam device, and more particularly to a device with a charged particle gun such as an electron gun.

BACKGROUND ART

PTL 1 relates to a charged particle generating device, in which "An electrode current is measured by an electrode current measuring unit 62 and a measured value of the electrode current is sent to an operation stop circuit 60. The operation stop circuit 60 stops at least one of application of an extraction voltage by an extraction voltage source 12 or supply of a heating current by a heating current source 16 based on the electrode current measured by the electrode current measuring unit 62."

PRIOR ART LITERATURE

Patent Literature

PTL 1: JP-A-2000-235838

SUMMARY OF INVENTION

Technical Problem

The charged particle generating device of PTL 1 detects the heating current and extraction electrode current of an electron source, and determines that the detected current is abnormal when the detected current is small, and stops the application of the extraction voltage by the extraction voltage source or heating by the heating current source based on the electrode current measured by the electrode current measuring unit. Accordingly, when an extraction-electrode power source fails and the extraction electrode current decreases, the charged particle generating device operates to stop heating of the electron source.

However, in the charged particle generating device of PTL 1, a state in which thermoelectrons are easily emitted continues after the heating of the electron source is stopped until a needle tip of the electron source called a chip is cooled, and therefore, there is a high possibility that damage may occur.

Accordingly, an object of the invention is to provide a charged particle beam device in which damage to a chip can be prevented with a simple configuration even when an extraction-electrode power source cannot apply a voltage to an extraction electrode due to a failure or the like.

Solution to Problem

The present application includes a plurality of methods of solving at least a part of the above-described problems. Examples of such methods are as follows.

According to one aspect of the invention, a charged particle beam device includes a charged particle source; an extraction electrode configured to extract a charged particle from the charged particle source; an extraction-electrode power source configured to apply a voltage to the extraction electrode; an acceleration electrode configured to accelerate the charged particle; an acceleration power source configured to apply a voltage to the acceleration electrode; and a diode and a resistor connected in series between a middle stage of the acceleration power source and an output side of the extraction-electrode power source.

Advantageous Effect

According to the invention, with a simple configuration, charged particles can be continuously extracted even when the extraction-electrode power source cannot apply a voltage, and damage to the chip due to inability to extract the charged particles can be prevented.

Problems, configurations, and effects other than those described above will be clarified by the following description of embodiments.

DESCRIPTION OF EMBODIMENTS

In order to improve the understanding of the embodiments, first, supplementary description will be given on damage to a chip of a charged particle gun.

Generally, a charged particle beam device used for semiconductor inspection or the like emits charged particles to a target using a charged particle gun (for example, an electron gun). The charged particle gun first releases charged particles from a charged particle source, then generates an electric field by an electrode called an extraction electrode to which a voltage is applied, extracts the charged particles in a direction of emitting a beam, accelerates the particles by an acceleration voltage, and emits the particles to the target. At this time, the charged particle source is applied with the acceleration voltage by an acceleration power source, and the target has a voltage about 0 V.

Here, among the charged particle guns, those that release particles from the charged particle source by heat (for example, a Schottky electron gun or a thermoelectron gun) heat the charged particle source by electricity so that the charged particles are easily ejected, and the charged particles are extracted by the extraction electrode. At this time, if the extraction by the extraction electrode is not performed even though the charged particle source is heated, there is a problem that a needle tip of the charged particle source called a chip is damaged. When the chip of the charged particle gun is damaged, the charged particle beam device does not operate normally. In addition, since it is necessary to open a high vacuum portion of the charged particle beam device once to replace the chip, it takes time and effort, and further, a period during which the charged particle beam device cannot be used becomes longer. In addition, the price of the chip itself is high, and the cost for replacement becomes high for a user of the device.

For this reason, it is necessary for the heated particle source to have an electric field applied by the extraction electrode, and it is desirable to continue the extraction of the charged particles even when an unintentional stop of the device is generated due to a failure of an extraction-electrode power source.

Hereinafter, a plurality of embodiments of the invention will be described with reference to the drawings. In each embodiment, a charged particle beam device including an electron gun that emits electrons will be described as an example.

First Embodiment

Figure 1:
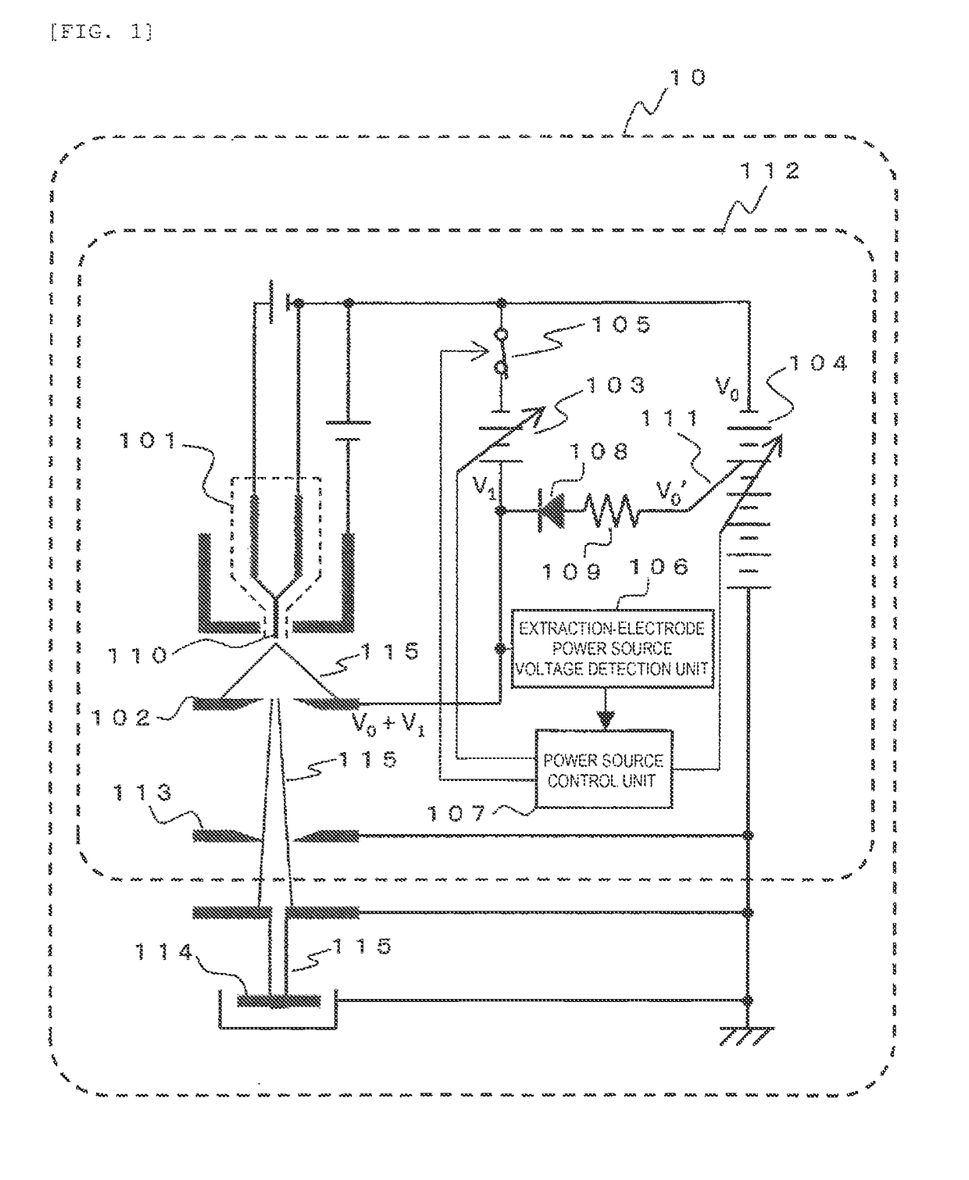
FIG. 1 is a diagram showing a configuration example of a charged particle beam device according to a first embodiment.

FIG. 1 is a diagram showing a configuration example of a charged particle beam device 10 according to a first embodiment.

The charged particle beam device 10 includes an electron source 101, an extraction electrode 102, an extraction-electrode power source 103, an acceleration power source 104, an extraction-electrode power source node switch 105, an extraction-electrode power source voltage detection unit 106, a power source control unit 107, a diode 108, a resistor 109, a chip 110, a middle stage terminal 111, and an acceleration electrode 113. These components are parts related to electron release and acceleration, and can be referred to as an electron gun 112. An electron beam 115 released from the electron gun 112 is emitted onto a target 114 such as a sample to be measured which is placed on a stage via a diaphragm, for example.

The electron source 101 is an electron emission source. The chip 110 is a needle tip portion that becomes an electron emission point of the electron source 101. The extraction electrode 102 extracts electrons generated from the electron source 101 in a direction of the target 114. The extraction-electrode power source 103 applies a voltage to the extraction electrode 102, the voltage is positive with respect to an electron source potential. The acceleration electrode 113 attracts electrons extracted by the extraction electrode 102 and accelerates the electrons in the direction of the target 114. The acceleration power source 104 applies, to the acceleration electrode 113, a voltage for accelerating the electrons extracted by the extraction electrode 102.

The extraction-electrode power source node switch 105 electrically connects or disconnects a node connected to the extraction-electrode power source 103, that is, connects or disconnects the extraction-electrode power source 103 to or from a circuit. The extraction-electrode power source voltage detection unit 106 detects a voltage of the extraction-electrode power source 103. The power source control unit 107 controls output voltages of the acceleration power source 104 and the extraction-electrode power source 103. The power source control unit 107 can turn on and off a heating power source for heating the electron source 101.

The middle stage terminal 111 is extracted from a middle stage of the acceleration power source 104 and outputs a voltage of the middle stage of the acceleration power source 104. The diode 108 and the resistor 109 are connected in series between the middle stage terminal 111 and a positive electrode side of the extraction-electrode power source 103 such that the anode of the diode 108 faces a middle stage terminal 111 side. The diode 108 is turned on to allow current to flow only when a voltage on an anode side is higher than that on a cathode side. The resistor 109 is connected to the anode side of the diode 108 and prevents an overcurrent from flowing when the diode 108 is turned on.

The diode 108 is not limited to a semiconductor diode element, and may be an element having a rectifying action such as a diode-connected transistor or vacuum tube. An order of series connection of the diode 108 and the resistor 109 may be reversed.

Next, an operation of the charged particle beam device 10 will be described.

At normal times, the extraction-electrode power source voltage detection unit 106 detects the output voltage of the extraction-electrode power source 103 as needed, and outputs the detected value to the power source control unit 107. The power source control unit 107 controls each power source so as to operate with a voltage output value of the acceleration power source 104 and a voltage output value of the extraction-electrode power source 103 input from a terminal (not shown) such as an external personal computer (PC). The power source control unit 107 monitors whether an abnormality has been generated in the extraction-electrode power source 103. As a specific example, the power source control unit 107 compares the detected value received from the extraction-electrode power source voltage detection unit 106 with a control value (which may be called voltage value) for setting the voltage output value of the extraction-electrode power source 103, and monitors whether there is a difference equal to or more than a predetermined threshold value (for example, equal to or more than 30%). The power source control unit 107 continues monitoring while the difference between the detected value and the control value is lower than the predetermined threshold value.

Here, when a negative electrode side voltage of the acceleration power source 104 at normal times is set as $V_0$, a positive electrode side voltage of the extraction-electrode power source 103 is set as $V_1$, and a voltage at the middle terminal 111 is set as $V_0'$, a voltage at the extraction electrode 102 can be expressed as $V_0+V_1$. An extraction position of the middle stage terminal 111 from the acceleration power source 104 is set so that $V_0+V_1>V_0'$ is established. As will be described later, $V_0'$ is used as a voltage instead of the positive electrode side voltage of the extraction-electrode power source 103, and therefore a value close to $V_0+V_1$ is desirable. When the charged particle beam device 10 is operated at such a voltage setting, the diode 108 is not turned on, and therefore, the middle stage terminal 111 and the extraction electrode 102 are not electrically connected.

Figure 2:
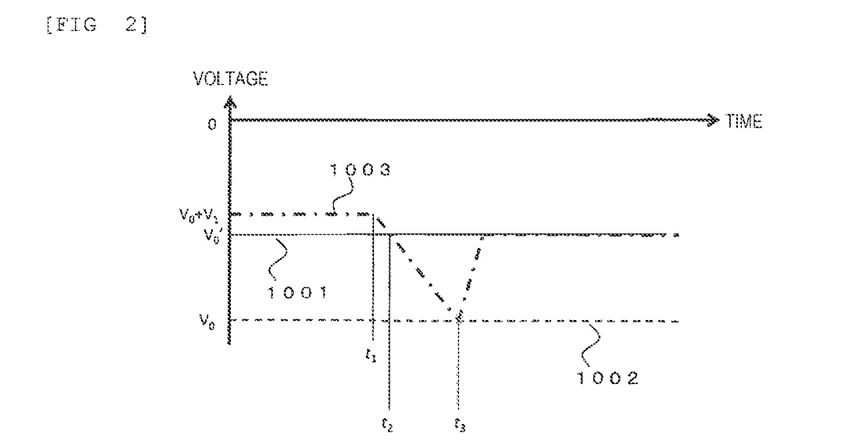
FIG. 2 is a timing chart showing an example of a change in voltage of an extraction-electrode power source according to the first embodiment.

When the power source control unit 107 determines that an abnormality has been generated in the extraction-electrode power source 103, as a specific example, when the difference between the detected value received from the extraction-electrode power source voltage detection unit 106 and the control value for setting the voltage output value of the extraction-electrode power source 103 is equal to or more than the predetermined threshold value (for example, equal to or more than 30%), the extraction-electrode power source 103 is stopped, and the extraction-electrode power source node switch 105 is turned off (disconnected). Stopping the extraction-electrode power source 103 and turning off the extraction-electrode power source node switch 105 may be performed simultaneously or sequentially from either one. With reference to FIG. 2, a change in voltage when an abnormality is generated will be described.

FIG. 2 is a timing chart showing an example of the change in the voltage of the extraction-electrode power source 103 according to the first embodiment. In FIG. 2, the voltage is shown on a vertical axis and the time is shown on a horizontal axis. In FIG. 2, the voltage $V_0'$ of the middle stage terminal is indicated by a solid line 1001, an acceleration voltage $V_0$ is indicated by a broken line 1002, and an extraction electrode voltage is indicated by a one-dot chain line 1003.

Until time point $t_1$, each voltage is a voltage during a normal operation that satisfies $V_0+V_1>V_0'$. If the extraction-electrode power source 103 fails at time point $t_1$, the output voltage $V_1$ decreases and the extraction electrode voltage $V_0+V_1$ approaches the acceleration voltage $V_0$. Thereafter, from time point $t_2$ when $V_0+V_1=V_0'$, the diode 108 is turned on and becomes conductive.

Here, there are two types of failure modes of the extraction-electrode power source 103, which are a short mode in which a positive electrode and a negative electrode are short-circuited and an open mode in which the positive electrode and the negative electrode are released. When the extraction-electrode power source 103 fails in the short mode, since a node through which a current flows is still formed even when the diode 108 is conductive, the extraction electrode voltage $V_0+V_1$ continues to approach the acceleration voltage $V_0$. At this time, even if the diode 108 is in a conductive state, a large current due to a short circuit between the middle stage terminal 111 and the output of the acceleration power source 104 does not flow due to the resistor 109, and the acceleration power source 104 continues to operate safely.

At time point $t_3$, when the extraction-electrode power source 103 is stopped by the power source control unit 107 and the extraction-electrode power source node switch 105 is turned off (disconnected), the extraction electrode voltage $V_0+V_1$ is increased to the middle stage terminal voltage $V_0'$ by the conducted diode 108. When the extraction-electrode power source 103 fails in the open mode at time point $t_1$, the extraction electrode voltage drops to the middle stage terminal voltage $V_0'$ by the conducted diode 108 from $V_0+V_1$.

In the example of FIG. 2, the extraction-electrode power source 103 is stopped and the extraction-electrode power source node switch 105 is disconnected at timing $t_3$ when the extraction electrode voltage $V_0+V_1$ becomes the acceleration voltage $V_0$, but the operations are not limited to the timing $t_3$. For example, the operations may be performed at time point $t_1$ or after time point $t_1$, or after time point $t_3$. An earlier time (for example, the earliest time point $t_1$) is preferable in terms of immediately eliminating an unstable voltage state due to the failed extraction-electrode power source 103. The extraction-electrode power source 103 is not necessarily controlled to be stopped, but it is desirable to stop the extraction-electrode power source 103 in terms of eliminating the unstable voltage state due to the failed extraction-electrode power source 103.

Figure 3:
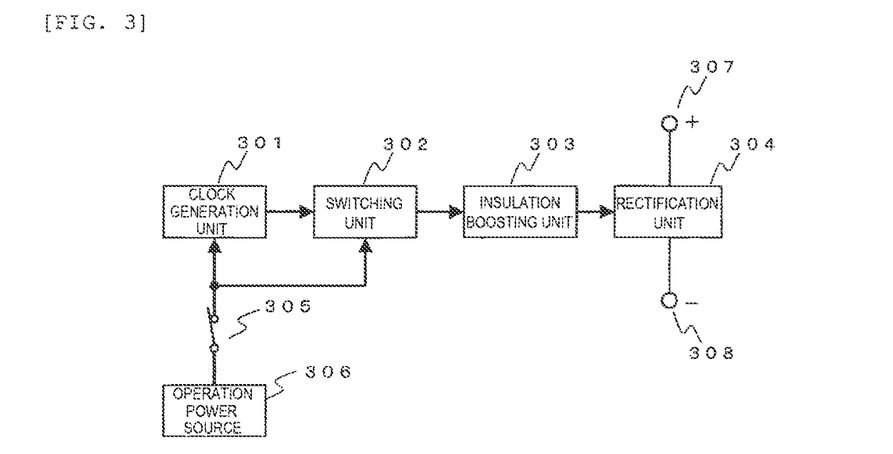
FIG. 3 is a diagram showing a configuration example of the extraction-electrode power source according to the first embodiment.

FIG. 3 is a diagram showing a configuration example of the extraction-electrode power source 103 according to the first embodiment.

The extraction-electrode power source 103 includes a clock generation unit 301, a switching unit 302, an insulation boosting unit 303, a rectification unit 304, an operation power source switch 305, an operation power source 306, a power source positive electrode 307, and a power source negative electrode 308.

The clock generation unit 301 generates a clock signal that determines a signal cycle to be generated by the switching unit 302 and outputs the clock signal to the switching unit 302. The switching unit 302 generates a signal to be input to the insulation boosting unit 303 according to the clock signal and outputs the signal to the insulation boosting unit 303. The insulation boosting unit 303 boosts a voltage of the input signal at a constant magnification and outputs the boosted voltage to the rectification unit 304. The rectification unit 304 rectifies the signal boosted by the insulation boosting unit 303 into a direct current, and outputs the direct current from the power source positive electrode 307 which is a positive voltage terminal and the power source negative electrode 308 which is a negative voltage terminal. The operation power source switch 305 turns on or off power from the operation power source 306. The operation power source 306 supplies power to the clock generation unit 301 and the switching unit 302 via the operation power source switch 305.

When the power source control unit 107 detects an abnormality in the extraction-electrode power source 103, the power source control unit 107 stops the extraction-electrode power source 103 by turning off the operation power source switch 305. Of course, the method of stopping the extraction-electrode power source 103 is not limited to this. For example, the power source control unit 107 may stop the operation power source 306 itself without providing the operation power source switch 305.

Figure 4:
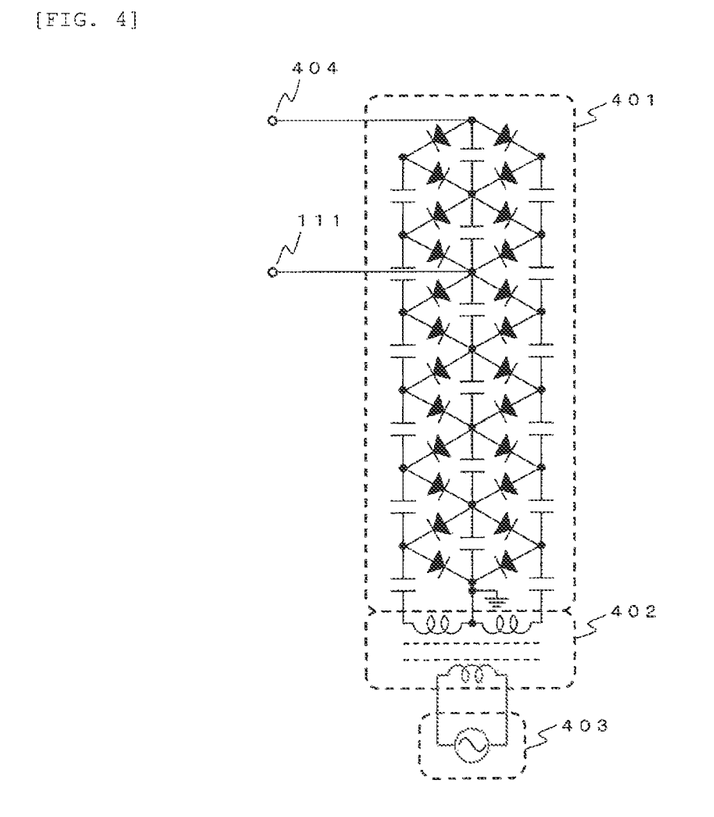
FIG. 4 is a diagram showing a configuration example of an acceleration power source according to the first embodiment.

FIG. 4 is a diagram showing a configuration example of the acceleration power source 104 according to the first embodiment.

The acceleration power source 104 includes a Cockcroft-Walton circuit (CW circuit) 401, an insulation boosting unit 402, a signal source 403, an acceleration voltage output terminal 404, and the middle stage terminal 111.

The signal source 403 generates an AC signal. The insulation boosting unit 402 boosts the AC signal generated by the signal source 403 at a constant magnification. The Cockcroft-Walton circuit 401 further boosts the AC signal boosted by insulation boosting unit 402 while rectifying the AC signal. The acceleration voltage output terminal 404 outputs the acceleration voltage from the Cockcroft-Walton circuit 401. The middle stage terminal 111 outputs a middle stage voltage from a middle stage of the Cockcroft-Walton circuit 401. Since the Cockcroft-Walton circuit 401 has a multi-stage configuration, a voltage divided from the output voltage of the Cockcroft-Walton circuit 401 can be obtained if a voltage is extracted from an intermediate stage by the middle stage terminal 111.

Of course, the acceleration power source 104 is not limited to the above configuration, and may be, for example, a configuration in which DC power sources are connected in series in a plurality of stages, or a configuration in which the outputs of the output transformer are rectified and connected in series.

The first embodiment of the invention has been described above. According to the charged particle beam device 10 of the present embodiment, the voltage for extracting electrons can be continuously applied to the extraction electrode 102 regardless of whether the extraction-electrode power source 103 fails in either the short mode or the open mode. Accordingly, damage to the chip 110 of the electron gun 112 due to the inability to extract electrons caused by the decrease in the extraction electrode voltage can be prevented.

Second Embodiment

The first embodiment assumes a case where the acceleration power source 104 has a capability of sufficiently flowing a current for extracting electrons even when the extraction-electrode power source 103 is stopped and the extraction-electrode power source node switch 105 is disconnected. On the other hand, a second embodiment relates to the case where the acceleration power source 104 does not have this capability. Hereinafter, a description will be given focusing on differences from the first embodiment.

Figure 5:
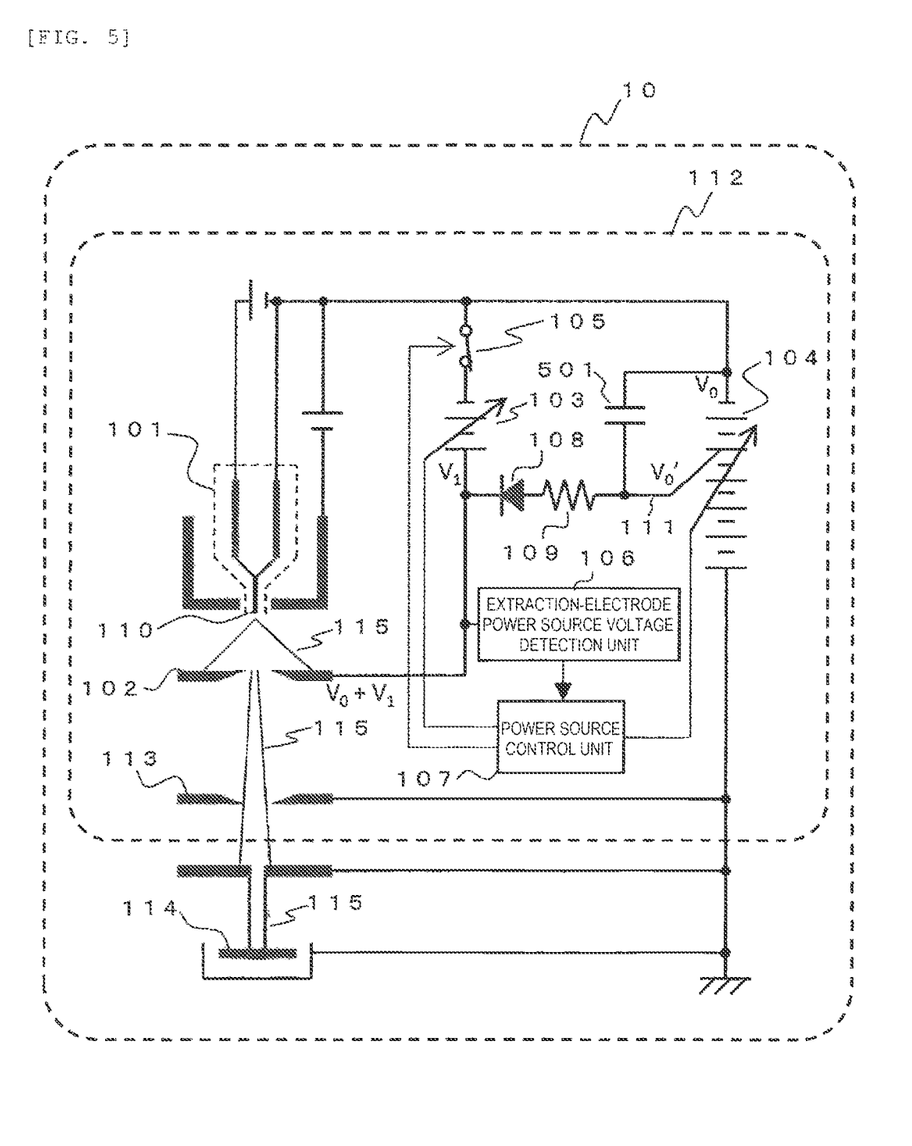
FIG. 5 is a diagram showing a configuration example of a charged particle beam device according to a second embodiment.

FIG. 5 is a diagram showing a configuration example of the charged particle beam device 10 according to the second embodiment. The charged particle beam device 10 includes a capacitor 501 in addition to the configuration of FIG. 1. The capacitor 501 is connected between a negative electrode side of the acceleration power source 104 and the middle stage terminal 111.

During the normal operation, charges are accumulated in the capacitor 501 due to a potential difference between the middle stage terminal 111 and output of the acceleration power source 104. When an abnormality is generated in the extraction-electrode power source 103, even if a value of current that can be discharged from the middle stage terminal 111 of the acceleration power source 104 is limited, the charge accumulated in the capacitor 501 is discharged. Accordingly, the current for extracting electrons can be temporarily supplemented.

Immediately after switching to the voltage of the middle stage terminal 111, a necessary current is output to the extraction electrode 102 for a predetermined period according to the capacity of the capacitor 501. However, since the necessary current cannot be continuously output after the predetermined period has elapsed, a state in which electrons are not extracted is entered. Therefore, in the present embodiment, it is desirable to immediately stop heating the electron source 101 by turning off the heating power source once the power source control unit 107 determines that an abnormality has been generated in the extraction-electrode power source 103.

According to the second embodiment, even after the electron source 101 is stopped being heated and starts to cool, electrons can be extracted by the capacitor 501 and the acceleration power source 104, so that the chip 110 of the electron gun 112 can be prevented from being damaged.

Third Embodiment

In a third embodiment, the extraction-electrode power source voltage detection unit 106 and the extraction-electrode power source node switch 105 of the first embodiment are shown as a specific circuit configuration example. Hereinafter, a description will be given focusing on differences from the first embodiment. Of course, the configuration of the third embodiment can also be applied to the second embodiment.

Figure 6:
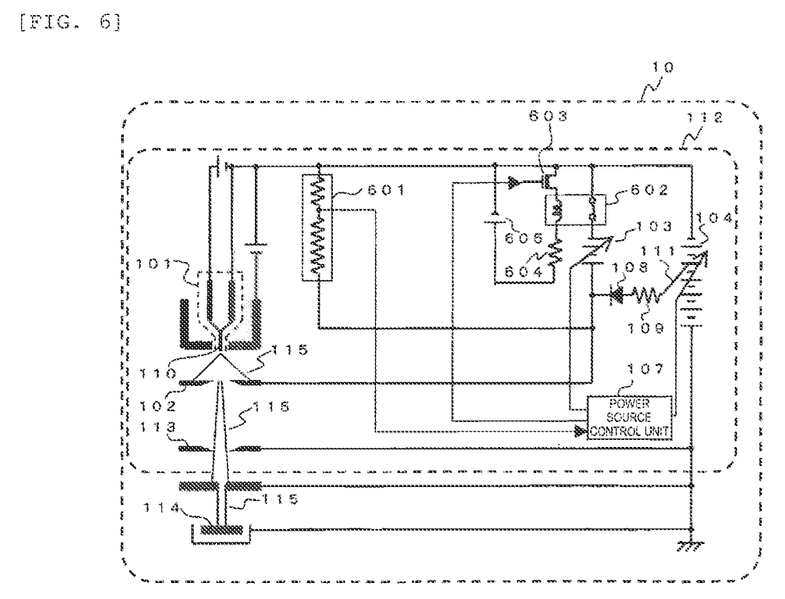
FIG. 6 is a diagram showing a configuration example of a charged particle beam device according to a third embodiment.

FIG. 6 is a diagram showing a configuration example of the charged particle beam device 10 according to the third embodiment.

The extraction-electrode power source voltage detection unit 106 according to the first embodiment may include a voltage dividing resistor 601 connected in parallel to both sides of the extraction-electrode power source 103. The voltage dividing resistor 601 divides the voltage of the extraction-electrode power source 103 and outputs the divided voltage to the power source control unit 107 as a detected voltage.

The extraction-electrode power source node switch 105 of the first embodiment includes a relay switch 602 that electrically connects or disconnects a node connected to the extraction-electrode power source 103, a transistor 603 that controls on and off of the relay switch 602, a load resistor 604 of the transistor 603, and a transistor power source 605. The relay switch 602 is turned on when a control current is flowing, and is turned off when the control current is not flowing. An on or off state of the transistor 603 is controlled by the power source control unit 107, so that the control current is controlled.

The voltage divided and output by the voltage dividing resistor 601 is $V_0 + V_1 \times R_r$, where $R_r$ is a voltage dividing ratio. The power source control unit 107 can calculate the output voltage $V_1$ of the extraction-electrode power source 103 by calculating back the output value. When the extraction-electrode power source 103 fails in the short mode, the voltage divided and output by the voltage dividing resistor 601 changes so as to approach $V_0$. When the extraction-electrode power source 103 fails in the open mode, the voltage divided and output by the voltage dividing resistor 601 changes so as to approach $V_0'$.

The operation of the charged particle beam device 10 according to the third embodiment will be described.

At normal times, the power source control unit 107 compares the voltage value of the extraction-electrode power source 103 calculated as described above with the control value (which may be called voltage value) for setting the voltage output value of the extraction-electrode power source 103, and monitors whether there is a difference equal to or more than a predetermined threshold value (for example, equal to or more than 30%). The power source control unit 107 continues monitoring while the difference between the calculated value and the control value is lower than the predetermined threshold value, and outputs a HIGH signal to a gate of the transistor 603 to turn on the transistor 603. When the transistor 603 is turned on, a control current flows from the transistor power source 605 to the relay switch 602 via the load resistor 604. When the control current flows, the relay switch 602 is turned on, and a negative electrode side of the extraction-electrode power source 103 and a negative electrode node of the acceleration power source 104 are connected.

When the difference between the voltage value of the extraction-electrode power source 103 calculated as described above and the control value (which may be called voltage value) for setting the voltage output value of the extraction-electrode power source 103 is equal to or more than the predetermined threshold value (for example, equal to or more than 30%), the power source control unit 107 outputs a LOW signal to the gate of the transistor 603 to turn off the transistor 603. When the transistor 603 is turned off, there is no current path flowing from the transistor power source 605, so that the control current of the relay switch 602 is stopped. Once the control current is stopped, the relay switch 602 is turned off, and the negative electrode side of the extraction-electrode power source 103 and the negative electrode node of the acceleration power source 104 are disconnected.

In the present embodiment, the relay switch 602 that operates to turn off when the control current flows and to turn on when the current does not flow may be used. In this case, the HIGH and LOW control of the gate of the transistor 603 may be reversed.

Fourth Embodiment

A fourth embodiment is a modification of the third embodiment in which the function of monitoring the voltage of the extraction-electrode power source 103 by the power source control unit 107 is performed by a unit different from the power source control unit 107. Hereinafter, a description will be given focusing on differences from the third embodiment. Of course, the configuration of the fourth embodiment can also be applied to the second embodiment.

Figure 7:
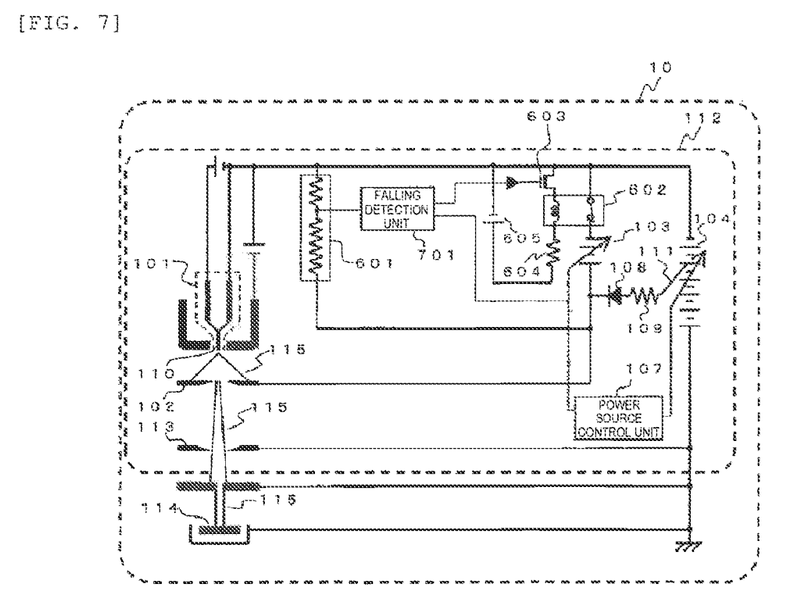
FIG. 7 is a diagram showing a configuration example of a charged particle beam device according to a fourth embodiment.

FIG. 7 is a diagram showing a configuration example of the charged particle beam device 10 according to the fourth embodiment.

The charged particle beam device 10 according to the fourth embodiment has a falling detection unit 701. The falling detection unit 701 is connected between the voltage dividing resistor 601 and the transistor 603. The power source control unit 107 is not connected to the voltage dividing resistor 601 or the transistor 603. The voltage dividing resistor 601 divides the voltage of the extraction-electrode power source 103 and outputs the divided voltage to the falling detection unit 701 as a detected voltage. The on and off state of the transistor 603 is controlled by the falling detection unit 701, so that the control current is controlled.

As described above, when the extraction-electrode power source 103 fails in the short mode, the voltage divided and output by the voltage dividing resistor 601 changes so as to approach $V_0$. When the extraction-electrode power source 103 fails in the open mode, the voltage divided and output by the voltage dividing resistor 601 changes so as to approach $V_0'$. The falling detection unit 701 detects a falling of the output signal of the voltage dividing resistor 601. When the falling is detected, the falling detection unit 701 outputs a LOW signal to the gate of the transistor 603 and operates to disconnect the relay switch 602, thereby disconnecting a negative electrode side node of the extraction-electrode power source 103. In addition, when the falling is detected, the falling detection unit 701 stops the extraction-electrode power source 103.

Figure 8:
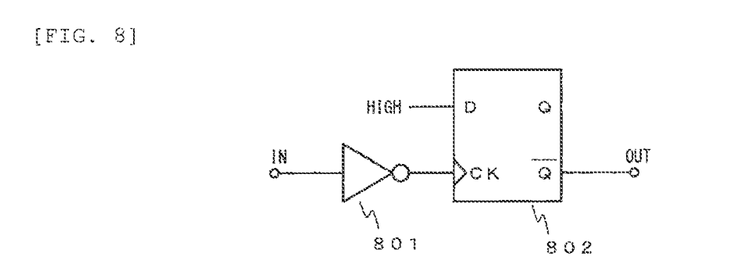
FIG. 8 is a diagram showing a configuration example of a falling detection unit according to the fourth embodiment.

FIG. 8 is a diagram showing a configuration example of the falling detection unit 701 according to the fourth embodiment. FIG. 8 shows a configuration for detecting the falling of the output signal of the voltage dividing resistor 601. The falling detection unit 701 includes a NOT circuit 801 to which the output signal of the voltage dividing resistor 601 is input, and a D-type flip-flop circuit 802 in which the output signal of the NOT circuit 801 is input to a clock (CK) terminal. A HIGH signal is input to a D terminal of the D-type flip-flop circuit 802.

According to the present embodiment, as compared with the third embodiment, a situation in which an abnormality is generated in the power source control unit 107 and the relay switch 602 cannot be disconnected can be avoided, and the relay switch 602 is disconnected by the extraction electrode 102 by the falling detection unit 701, and the voltage can be continuously applied to the extraction electrode 102.

Fifth Embodiment

Figure 9:
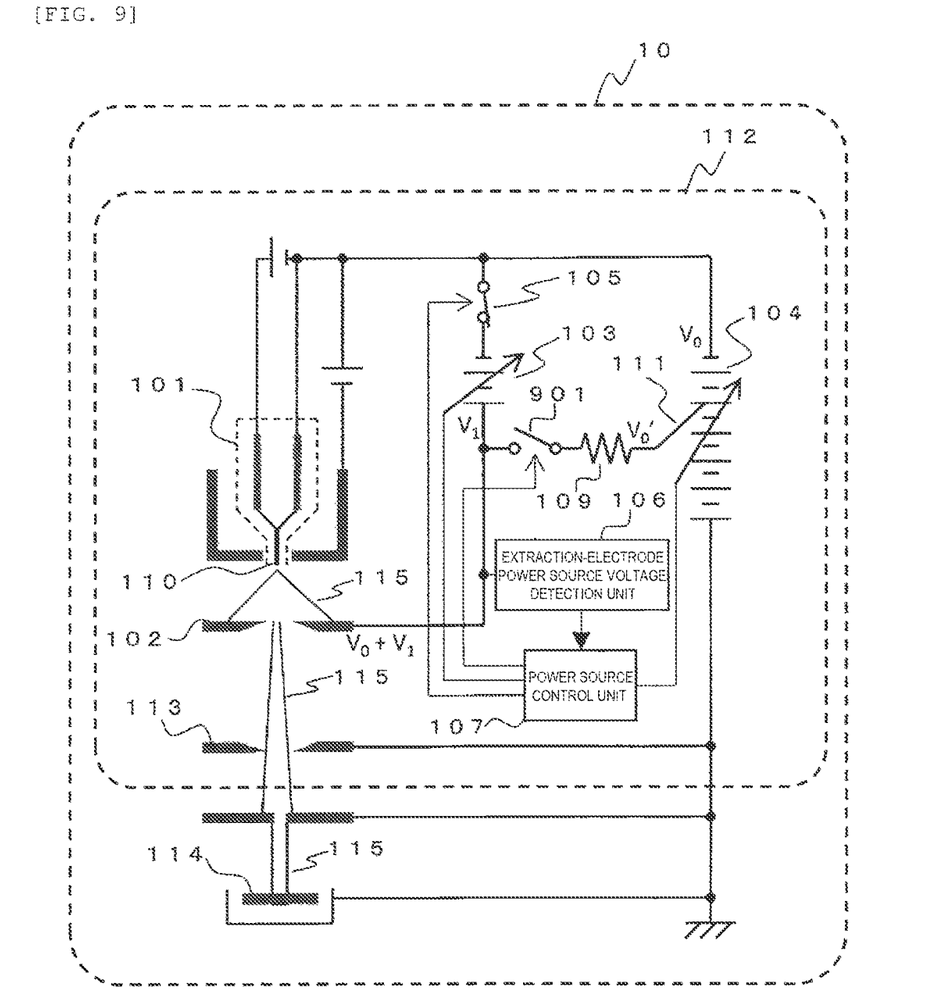
FIG. 9 is a diagram showing a configuration example of a charged particle beam device according to a fifth embodiment.

FIG. 9 is a diagram showing a configuration example of the charged particle beam device 10 according to a fifth embodiment.

The fifth embodiment is a modification of the first embodiment, and instead of the diode 108, a middle stage switch 901 that is controlled by the power source control unit 107 and disconnected during the normal operation is provided.

The description will focus on the differences from the operation of the first embodiment. When the power source control unit 107 determines that an abnormality has been generated in the extraction-electrode power source 103, as a specific example, when the difference between the detected value received from the extraction-electrode power source voltage detection unit 106 and the control value for setting the voltage output value of the extraction-electrode power source 103 is equal to or more than the predetermined threshold value (for example, equal to or more than 30%), the extraction-electrode power source 103 is stopped, the extraction-electrode power source node switch 105 is turned off (disconnected), and in addition, the middle stage switch 901 is turned on (connected).

According to the present embodiment, compared with the first embodiment, the middle stage terminal 111 and the extraction electrode 102 can be explicitly connected by control, and therefore any desired connection timing can be determined.

The invention is not limited to the embodiments described above, and includes various modifications. For example, the above-described embodiments have been described in detail for easy understanding of the invention, and are not necessarily limited to one having all the configurations described. Part of the configuration of a certain embodiment can be replaced with the configuration of another embodiment, and the configuration of another embodiment can be added to the configuration of the certain embodiment. In addition, it is possible to add, delete, and replace other configurations for a part of the configuration of each embodiment.

In each of the above-described embodiments, the electron gun that emits electrons has been described as an example. However, the invention is not limited thereto and can be applied to a charged particle beam device that handles charged particles. Unlike in the case of handling electrons with negative charges, when handling charged particles with positive charges, positive electrodes and negative electrodes of each power source shown in FIG. 1 are configured in reverse, and a cathode direction and an anode direction of the diode 108 shown in FIG. 1 are connected.

The invention is not limited to the charged particle beam device, and can be provided in various modes such as a control method thereof.

REFERENCE SIGN LIST

10: charged particle beam device
101: electron source
102: extraction electrode
103: extraction-electrode power source
104: acceleration power source
105: extraction-electrode power source node switch
106: extraction-electrode power source voltage detection unit
107: power source control unit
108: diode
109: resistor
110: chip
111: middle stage terminal
112: electron gun
113: acceleration electrode
114: target 115: electron beam
301: clock generation unit
302: switching unit
303: insulation boosting unit
304: rectification unit
305: operation power source switch
306: operation power source
307: power source positive electrode
308: power source negative electrode
401: Cockcroft-Walton circuit
402: insulation boosting unit
403: signal source
404: acceleration voltage output terminal
501: capacitor
601: voltage dividing resistor
602: relay switch
603: transistor
604: load resistor
605: transistor power source
701: falling detection unit
801: NOT circuit
802: D-type flip-flop circuit
901: middle stage switch

The invention claimed is:

1. A charged particle beam device comprising:
a charged particle source;
an extraction electrode configured to extract a charged particle from the charged particle source;
an extraction-electrode power source configured to apply a voltage to the extraction electrode;
an acceleration electrode configured to accelerate the charged particle;
an acceleration power source configured to apply a voltage to the acceleration electrode;
a diode and a resistor connected in series between a middle stage of the acceleration power source and an output side of the extraction-electrode power source;
a power source control unit configured to control the acceleration power source and the extraction-electrode power source; and
an extraction-electrode power source node switch configured to disconnect the extraction-electrode power source from a circuit, wherein
the power source control unit turns off the extraction-electrode power source node switch when a generation of an abnormality in the extraction-electrode power source is detected,
the extraction-electrode power source voltage detection unit is configured to detect a voltage of the extraction-electrode power source, and
the power source control unit detects the generation of the abnormality in the extraction-electrode power source using the voltage detected by the extraction-electrode power source voltage detection unit.

2. The charged particle beam device according to claim 1, wherein
the power source control unit turns off the extraction-electrode power source node switch and stops the extraction-electrode power source when the generation of the abnormality in the extraction-electrode power source is detected.

3. The charged particle beam device according to claim 1, wherein
a cathode of the diode is connected to the output side of the extraction-electrode power source.

4. A charged particle beam device comprising:
a charged particle source;
an extraction electrode configured to extract a charged particle from the charged particle source;
an extraction-electrode power source configured to apply a voltage to the extraction electrode;
an acceleration electrode configured to accelerate the charged particle;
an acceleration power source configured to apply a voltage to the acceleration electrode;
a diode and a resistor connected in series between a middle stage of the acceleration power source and an output side of the extraction-electrode power source; and
a capacitor connected between the middle stage and output of the acceleration power source.

5. The charged particle beam device according to claim 4, further comprising:
a power source control unit configured to control the acceleration power source and the extraction-electrode power source; and
an extraction-electrode power source node switch configured to disconnect the extraction-electrode power source from a circuit, wherein
the power source control unit turns off the extraction-electrode power source node switch and stops heating of the charged particle source when a generation of an abnormality in the extraction-electrode power source is detected.

6. A charged particle beam device comprising:
a charged particle source;
an extraction electrode configured to extract a charged particle from the charged particle source;
an extraction-electrode power source configured to apply a voltage to the extraction electrode;
an acceleration electrode configured to accelerate the charged particle;
an acceleration power source configured to apply a voltage to the acceleration electrode;
a diode and a resistor connected in series between a middle stage of the acceleration power source and an output side of the extraction-electrode power source; and
a power source control unit configured to control the acceleration power source and the extraction-electrode power source;
an extraction-electrode power source node switch configured to disconnect the extraction-electrode power source from a circuit; and
a falling detection unit configured to detect a falling of a voltage of the extraction-electrode power source, wherein
the falling detection unit turns off the extraction-electrode power source node switch when the falling of the voltage of the extraction-electrode power source is detected.

7. The charged particle beam device according to claim 6, wherein
the falling detection unit turns off the extraction-electrode power source node switch and stops the extraction-electrode power source when the falling of the voltage of the extraction-electrode power source is detected.

8. A charged particle beam device comprising:
a charged particle source;
an extraction electrode configured to extract a charged particle from the charged particle source;
an extraction-electrode power source configured to apply a voltage to the extraction electrode;

an acceleration electrode configured to accelerate the charged particle;

an acceleration power source configured to apply a voltage to the acceleration electrode; and a switch and a resistor connected in series between a middle stage of the acceleration power source and an output side of the extraction-electrode power source.

9. The charged particle beam device according to claim 8, further comprising:

a power source control unit configured to control the acceleration power source and the extraction-electrode power source; and an extraction-electrode power source node switch configured to disconnect the extraction-electrode power source from a circuit, wherein the power source control unit turns off the extraction-electrode power source node switch when a generation of an abnormality in the extraction-electrode power source is detected.

10. The charged particle beam device according to claim 9, wherein the power source control unit turns off the extraction-electrode power source node switch and stops the extraction-electrode power source when the generation of the abnormality in the extraction-electrode power source is detected.

11. The charged particle beam device according to claim 9, further comprising:

an extraction-electrode power source voltage detection unit configured to detect a voltage of the extraction-electrode power source, wherein the power source control unit detects the generation of the abnormality in the extraction-electrode power source using the voltage detected by the extraction-electrode power source voltage detection unit.

12. The charged particle beam device according to claim 8, further comprising:

a capacitor connected between the middle stage and output of the acceleration power source.

13. The charged particle beam device according to claim 8, wherein the acceleration power source is a Cockcroft-Walton circuit.

14. The charged particle beam device according to claim 1, wherein the acceleration power source is a Cockcroft-Walton circuit.

15. The charged particle beam device according to claim 4, wherein the acceleration power source is a Cockcroft-Walton circuit.

16. The charged particle beam device according to claim 6, wherein the acceleration power source is a Cockcroft-Walton circuit.

17. The charged particle beam device according to claim 1, further comprising:

a capacitor connected between the middle stage and output of the acceleration power source.

18. The charged particle beam device according to claim 6, further comprising:

a capacitor connected between the middle stage and output of the acceleration power source.

* * * * *